(12) United States Patent
Wong et al.

(10) Patent No.: US 6,243,265 B1
(45) Date of Patent: Jun. 5, 2001

(54) PROCESSOR EMI SHIELDING

(75) Inventors: Thomas Wong, Seattle; Neal Ulen, Lacey, both of WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/413,417

(22) Filed: Oct. 6, 1999

(51) Int. Cl.⁷ ...................................... H05K 7/20
(52) U.S. Cl. ........................ 361/704; 361/707; 361/816; 257/713; 165/185
(58) Field of Search ................. 361/702–712, 361/714–723, 760, 783, 816, 818, 820, 773, 683, 687–690, 832; 257/706–727, 659, 660, 691, 778, 625; 174/16.3, 35 R, 260, 51, 35 GC; 165/80.3, 185, 80.2, 80.4, 165; 24/570, 573.1, 533, 534, 598.1, 598.2, 625; 248/316.7, 500–510

(56) References Cited

U.S. PATENT DOCUMENTS

| | | | |
|---|---|---|---|
| 4,384,165 | * | 5/1983 | Loving et al. .................. 174/35 GC |
| 5,053,924 | * | 10/1991 | Kurgan .................................. 361/424 |
| 5,138,529 | * | 8/1992 | Colton et al. ......................... 361/424 |
| 5,241,453 | * | 8/1993 | Bright et al. .......................... 361/704 |
| 5,357,404 | * | 10/1994 | Bright et al. .......................... 361/818 |
| 5,541,811 | * | 7/1996 | Henningsson et al. .............. 361/704 |
| 5,566,052 | * | 10/1996 | Hudges ................................. 361/704 |
| 5,734,556 | * | 3/1998 | Sanienejad et al. .................. 361/719 |
| 5,804,875 | * | 9/1998 | Remsburg et al. ................... 257/718 |
| 5,866,943 | * | 2/1999 | Mertol .................................. 257/712 |
| 5,901,040 | * | 5/1999 | Cromwell et al. ................... 361/704 |
| 6,011,299 | * | 1/2000 | Brench ................................. 257/660 |
| 6,049,469 | * | 4/2000 | Hood et al. .......................... 361/818 |
| 6,063,999 | * | 5/2000 | Kelly .................................. 174/35 R |
| 6,071,128 | * | 6/2000 | Brewington et al. .................. 439/73 |
| 6,075,702 | * | 6/2000 | Gardner et al. ...................... 361/704 |

FOREIGN PATENT DOCUMENTS

409027576A * 1/1997 (JP) ............................... H01L/23/40
411214593A * 8/1999 (JP) ............................... H01L/23/32

* cited by examiner

*Primary Examiner*—Leo P. Picard
*Assistant Examiner*—Michael Datskovsky
(74) *Attorney, Agent, or Firm*—Schwegman, Lundberg, Woessner & Kluth, P.A.

(57) ABSTRACT

A heat sink retention module provides physical support for a heat sink while providing an electrical ground path for the heat sink. The retention module includes a ground strip that maintains an electrical contact with the heat sink while contacting a circuit board ground connection. In one embodiment, the ground strip includes upwardly extending spring members that contact the heat sink. In another embodiment, the ground strip includes a Faraday Cage formed from downwardly extending tabs. The retention module can be used in conjunction with an electrically conductive heat sink to provide a ground plane over an integrated circuit to shield the circuit from electromagnetic interference.

17 Claims, 3 Drawing Sheets

PROCESSOR EMI SHIELDING

TECHNICAL FIELD OF THE INVENTION

The present invention relates generally to heat sinks and in particular the present invention relates to grounding a heat sink using an electromagnetic interference (EMI) retention module.

BACKGROUND

Historically, when microprocessors were first commercialized, each microprocessor held less than one million transistors, and operated at speeds below 20 MHZ. Typically, the microprocessors were either solder mounted onto a motherboard directly or mounted to the motherboard through sockets. They were typically air cooled, and air flow was typically sustained by a system fan. Because of the relatively slow operating speeds EMI and electrostatic discharge (ESD) shielding was not a high priority.

The number of transistors contained in each microprocessor, as well as the processor operating speed, have increased dramatically. Correspondingly, the amount of heat that needs to be dissipated, and the amount of EMI emissions that need to be absorbed have increased. Sensitivity to ESD during operations has also increased. As a result, most of today's microprocessor based computer systems employ either local fans and/or heat sinks to help ensure that the microprocessors will run cool. At the same time, increased attention has been given to the design of system chassis to ensure that adequate levels of EMI emission absorption and ESD resistance are met. The trend to increase transistor density and operating speed is expected to continue. It is expected that because of the amount of heat that needs to be dissipated, the precision of bonding between the processor package and a heat sink will reach a point of critical importance. That is, the physical bond between the processor package and the heat sink plays a critical role in heat dissipation.

EMI is produced in varying degrees by virtually every type of electrical equipment. Electromagnetic shielding is typically used to protect electrical equipment from unwanted electromagnetic radiation or EMI. Many systems such as processors require at least some shielding for proper operation or to meet EMI requirements for emissions and immunity. As circuit speeds and sensitivities increase so will the need for improved shielding. Shielding can be generally described as a conductive or ferromagnetic material which either reflects, absorbs or carries electromagnetic interference to ground.

Electromagnetic shielding often provides protection for electrical equipment by reducing unwanted signals to levels that do not adversely affect equipment. This is achieved by both reflecting and absorbing the radiation signals. Reflection depends on a permeability and conductivity of the shielding material, and a frequency and wave impedance of the signal. Generally, the reflectance of a shielding material increases with frequency. The remaining signal passing through a shielding material is reduced by absorption. The resistivity and thickness of the shield, effects absorption. A magnetic material is more often effective in absorption.

To deal with low-frequency EMI, thick steel shields have been used to absorb the energy. However, absorption is more effective if the shield is protecting the electrical equipment from frequencies that are high. In addition, a shield have been provided which use a "Faraday Cage" to protect the circuits inside the shield. A Faraday cage is commonly known as an earthed metallic wire or gauze screen enclosing electrical equipment to shield it from the influence of external electric fields.

Heat dissipation has been decreased by using clips which physically hold a heat sink to the processor package. One such clip is a Single Edge Processor Package (SEPP). The problem with SEPP's is that it does not suppress EMI.

For the reasons stated above, and for other reasons stated below which will become apparent to those skilled in the art upon reading and understanding the present specification, there is a need in the art for improved EMI shielding for computer processors.

SUMMARY OF THE INVENTION

In one embodiment, the present invention relates to an electrically conductive ground strip comprising, a spring member that provides an electrical contact with a surface of a heat sink when the heat sink is positioned above an integrated circuit that is coupled to a circuit board, and a foot member forming a ground pad to provide an electrical contact with a ground connection of the circuit board.

In another embodiment, there is a heat sink retention module assembly comprising, a retention module for vertically supporting a heat sink that is located above, and in thermal contact with, an integrated circuit package. There is a ground strip coupled to the retention module, the ground strip comprising, an upwardly extending spring member that provides an electrical contact with a bottom surface of the heat sink, and a foot member forming a ground pad to provide an electrical contact with a ground connection of a circuit board located below the retention module and the integrated circuit package.

DETAILED DESCRIPTION OF THE DRAWINGS

Figure 1:
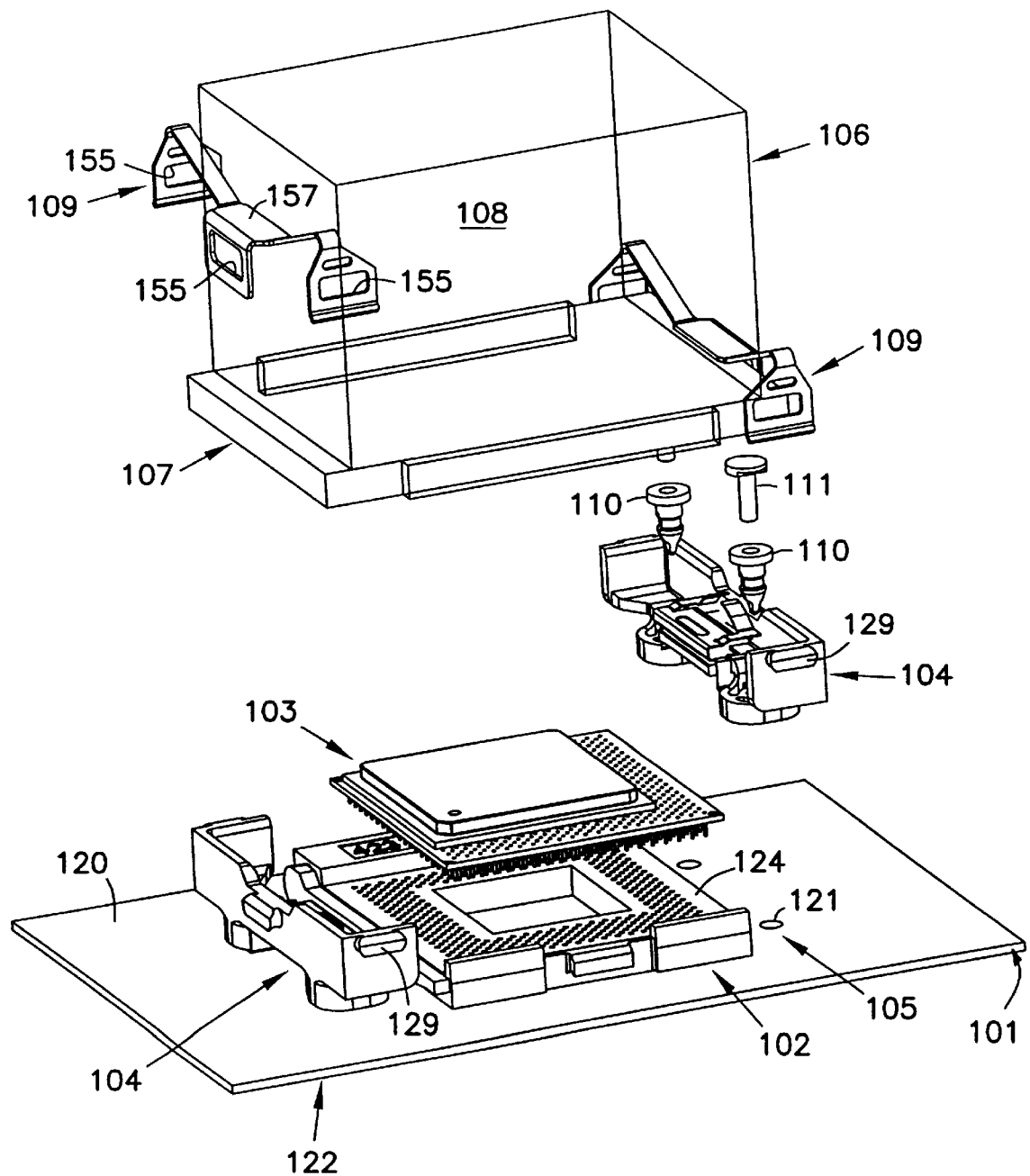
FIG. 1 is an expanded view of an EMI suppression device according to one embodiment of the present invention.

In the following detailed description of the invention reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

In one embodiment of the present invention, an EMI suppression assembly device is provided that has two retention modules that retain an EMI heat shield. The heat shield is physically coupled to an integrated circuit package to dissipate heat produced by the integrated circuit. The heat shield is typically metal, and thus conducts electricity. The retention modules each have an electrically conductive ground strip that couples the heat shield and an electrical ground connection, or pad, that is provided on a circuit board. In one embodiment, therefore, the ground strips have an electrical contact region which touches the heat sink and an electrical contact region which can be coupled to an electrical potential, such as ground. Thus, one embodiment of the invention provides a device to retain and ground an integrated circuit heat sink.

FIG. 1 illustrates an electromagnetic interference (EMI) suppression device that can be used to provide protection for an integrated circuit package. The EMI suppression device can be attached to a circuit board 101 having a top side 120 and a bottom side 122. The circuit board 101 can be any type of circuit board, but in one embodiment is a rigid board which contains mounting holes 121 for mounting retention, or retaining modules 104. A socket 102 is connected to the top side 120 of the board 101. The retaining modules 104 can be connected to the board in a variety of known manners, such as soldering. The retaining modules 104 can also be EMI retention modules. The socket 102 is provided with a number of female connections for providing electrical paths between male connectors and the circuit board 101. Thus, an integrated circuit package 103 having male connectors, or pins, is connected to a top portion 124 of the socket 102. While the present invention is not limited to male/female connectors, it is contemplated that one embodiment provides mounting of the integrated circuit package in a manner which allows for easy removal of the integrated circuit package.

Figure 2:
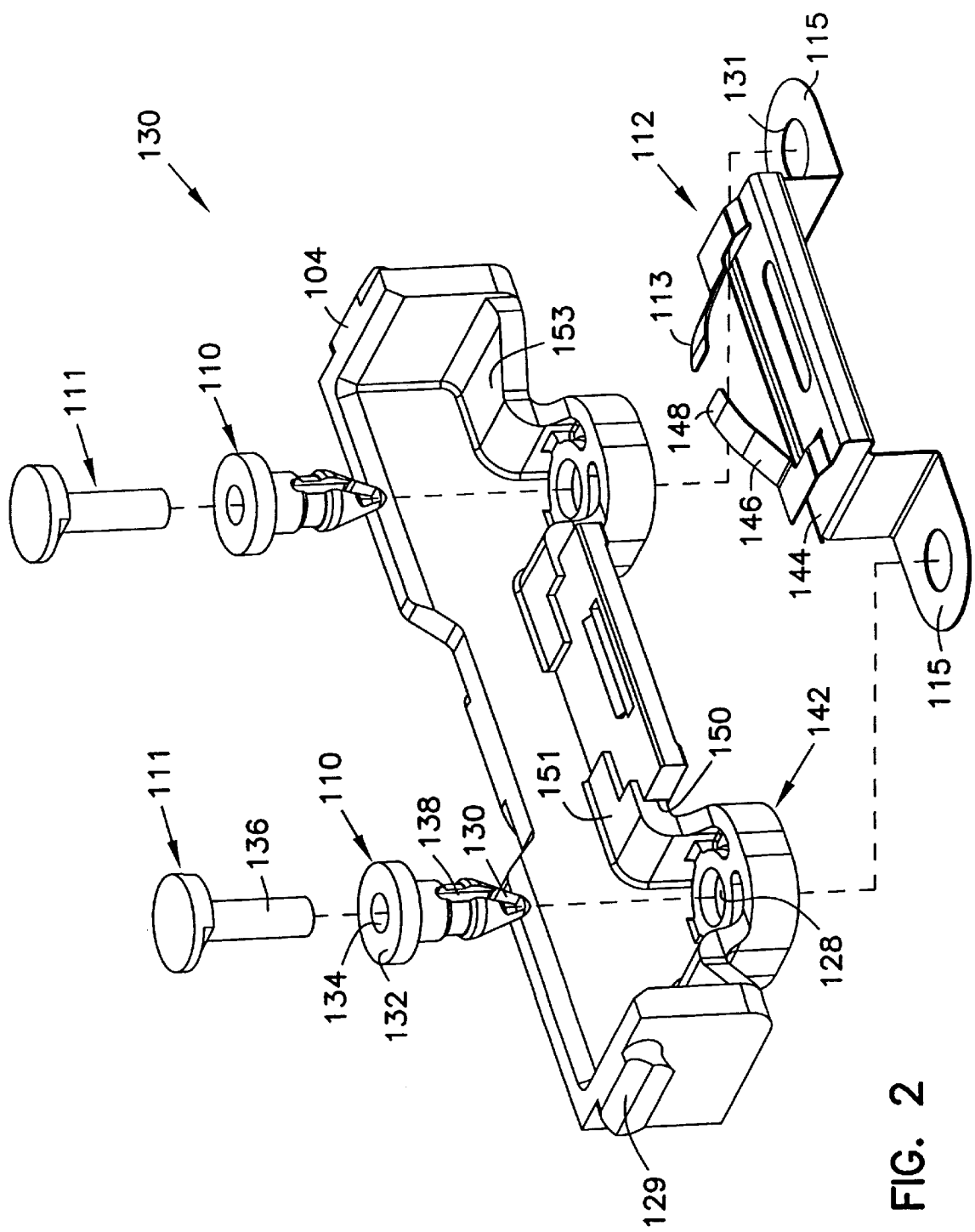
FIG. 2 is an expanded view of a retention module assembly of FIG. 1.

In the embodiment of FIG. 1, two retaining modules 104 are affixed to circuit board 101 by the use of expandable fasteners 110. The fasteners 110, shown in detail in FIG. 2, include a first end 130 which is vertically split by opening 138. The fasteners also have a second end 132 and an axially located hole 134. The fasteners 110 can be inserted through hole 128 of retention module 104, EMI ground strip 112, and mounting holes 121 of the circuit board 101.

Plungers 111 include a shaft sized to fit into hole 134 of the fasteners 110. By inserting the plungers 111 into the fasteners 110, the first end of the fasteners 110 expand and physically grip the circuit board 101. It will be appreciated that plungers 111 and fasteners 110 can be made of any resilient material, such as but not limited to nylon plastic. As explained above, the present invention provides protection for the integrated circuit package 103 by electrically grounding the heat sink 106. As such, grounds pads 105 are located on the top side of circuit board 101. The physical connection between EMI ground strip 112 and the circuit board 101 is important. Thus, the use of fasteners 111 and plungers 110 provides a secure connection that maintains a reliable connection. It will be appreciated that other fasteners, such as screws and rivets could be used, but may provide additional expense in manufacturing the assembly.

The ground 105 pads are electrically coupled to a voltage source (not shown), such as a voltage ground layer provided on circuit board 101. The two retention modules 104 located on opposing sides of socket 102 are shown in the embodiment of FIG. 1. It will be appreciated by those skilled in the art after studying the present description that a single retention module could be used without departing from the invention. Further, more than two modules can be provided.

EMI ground strip 112 provides a voltage ground path from the heat sink 106 to circuit board 101. The EMI ground strip 112 can be made from any conductive material, such as, but not limited to, 206 brass, stainless steel or copper. The ground strip 112 includes foot members 115 which provide a physical and electrical connection with the circuit board 101. The foot members 115 include a hole 131 which accepts fastener 110 as described above. The EMI ground strip 112 also includes upwardly extending spring members 113, or fingers, that provide a physical and electric connection with the heat sink 106 when assembled. The spring members 113 have a first deflectable end 148 and a second end 146. Because the vertical height of the heat sink 106 is dependant upon the numerous variables in the socket 102, and integrated circuit package 103, the first end of the spring members 113 can be deflected when assembled to the heat sink 106. The spring members 113, however, maintain an electrical contact with the heat sink 106. The ground strip 112 can be made stamped flat stock and folded to form the desired shape. The embodiment illustrated includes a bottom support 144 which fits within a groove 150 provided in the retention module 104. This assembly provides additional support for the ground strip 112.

Referring to FIG. 1, heat sink 106 is located on top of an integrated circuit package 103. It will be appreciated that the integrated circuit package 103 can contain any type of integrated circuit which produces heat, but the present invention is particularly suited for processors which operate at high speeds and produce relatively large amounts of heat. Heat sink designs vary, and the present invention is not limited to any specific design. In general, the heat sink 106 includes a base 107 and a heat dissipating region 108. The heat dissipation region 108 can be fins or rods which provide large surface areas for spreading heat. A fan is often used to provide air movement to increase the amount of heat dissipated over time. Heat sinks can be made of material with good heat dissipation characteristics, such as aluminum and copper. The size of heat sinks, and resultant weight, has resulted in need for supports to reduce the weight carried by the integrated circuit. Thus, the present invention provides both a physical support for the heat sink and an electrical path for grounding the heat sink 106.

The base 107 of the heat sink 106 extends laterally from the heat dissipating region and provides a platform securing the heat sink 106. Two retention clips 109 secure the heat sink 106 to the retention modules 104. The retention clips 109 include three openings 155 which can be coupled to tabs 129 provided on the retention modules. The clips 109 include a central pate 157 that contacts the heat sink base to secure the heat sink. In one embodiment, the clips 109 provide a downward force on the heat sink base 107 to hold the heat sink 106 in the retention modules 104. The heat sink 106, therefore, is securely connected to the EMI ground strip 112. The retention modules 104 support, or partially support, the heat sink 106. That is, the heat sink 106 needs to maintain thermal contact with the integrated circuit package 103 but should not fully rest upon the package. The retention modules 104, therefore, include support ledges 151 and 153 (see FIG. 2) which provide vertical support for the heat sink. Again, the ground strip 112 spring members 113 (see FIG. 2) maintain contact with the heat sink 106, but do not provide substantial vertical support for a heavy heat sink. The retention modules 104 also provide lateral support for the heat sink 106.

It will be appreciated with the benefit of the present description that mechanical changes can be made without departing from the present invention. These changes are often driven by assembly requirements and economic constraints. The present invention however provides a retention module for supporting a heat sink while electrically coupling the heat sink to a voltage (ground) to provide electrical shielding to sensitive electronic components. By providing a large grounded conductor plane (heat sink) over the electronic components, greater EMI protection results.

Figure 3:
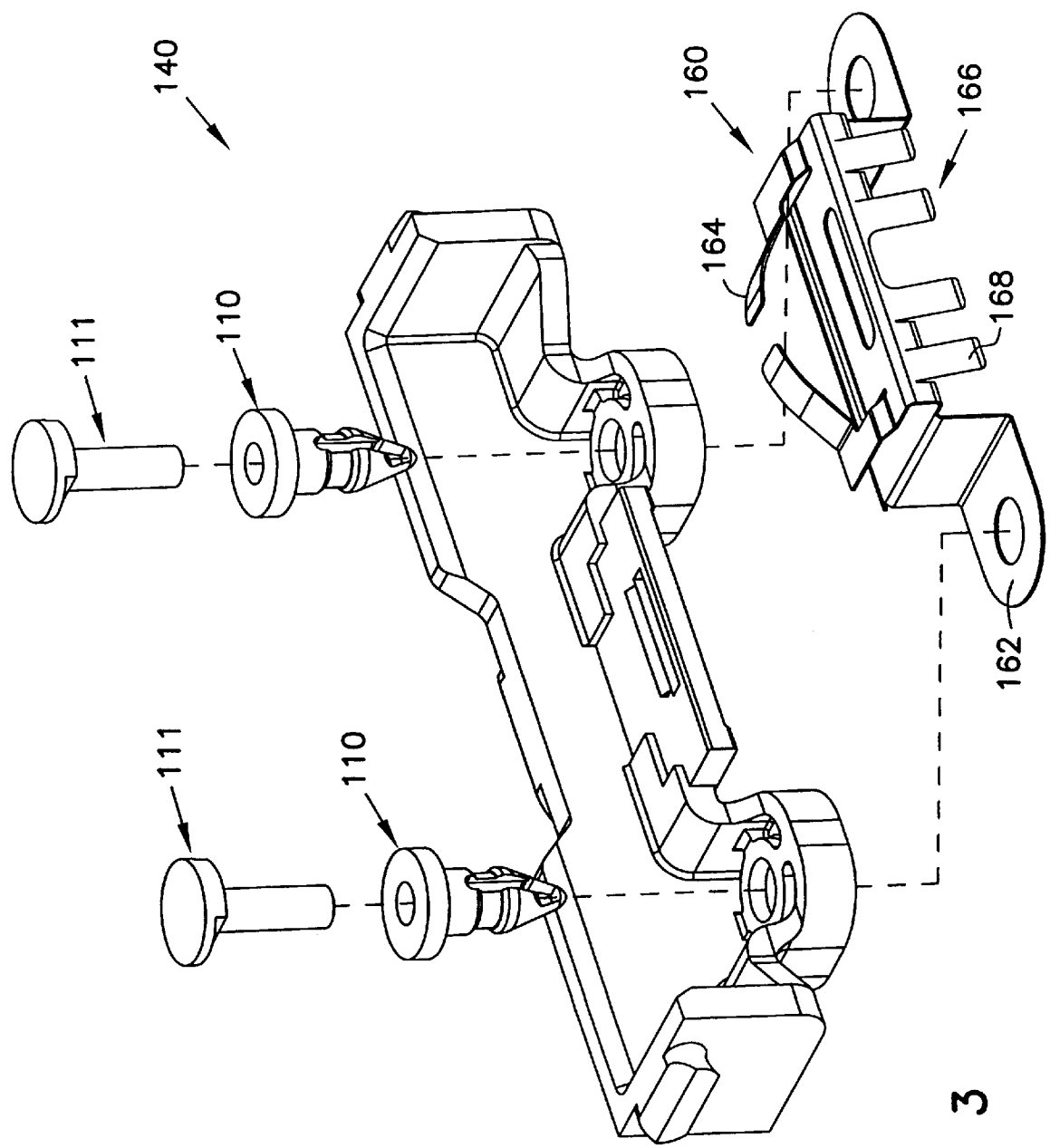
FIG. 3 is an expanded view of a retention module assembly of FIG. 1 including a Faraday Cage.

Referring to FIG. 3, an embodiment of an EMI retention module 140 is illustrated. The retention module includes an EMI ground strip 160. The ground strip 160 includes feet 162 and spring members 164, as explained above. The ground strip 160 also includes a Faraday Cage 166 which is formed from numerous downwardly extending tabs 168. The Faraday cage 166 is affixed or integral with the EMI ground strip 160. The Faraday cage 166 may be made of any conductive material such as brass, copper or stainless steel. The Faraday Cage 166, therefore, is provided close to the integrated circuit package 103 to shield it from the influence of external electric fields.

CONCLUSION

A heat sink retention module has been described which provides physical support for the heat sink while providing an electrical ground path for the heat sink. The retention module includes a ground strip that maintains an electrical contact with the heat sink while contacting a circuit board ground connection. In one embodiment, the ground strip includes upwardly extending spring members that contact the heat sink. In another embodiment, the ground strip includes a Faraday Cage formed from downwardly extending tabs. The retention module can be used in conjunction with an electrically conductive heat sink to provide a ground plane over an integrated circuit to shield the circuit from electromagnetic interference.

Although specific embodiments have been illustrated and described herein, it will be appreciated by those of ordinary skill in the art that any arrangement which is calculated to achieve the same purpose may be substituted for the specific embodiment shown. This application is intended to cover any adaptions or variations of the present invention. Therefore, it is manifestly intended that this invention be limited only by the claims and equivalents thereof.

What is claimed is:

1. An electrically conductive ground strip comprising:
   a spring member that provides an electrical contact with a bottom surface of a heat sink when the heat sink is positioned above an integrated circuit that is coupled to a circuit board; and
   a foot member forming a ground pad to provide an electrical contact with a ground connection of the circuit board.

2. The electrically conductive ground strip of claim 1 wherein the spring member is an upwardly extending finger having a first deflectable end that contacts a bottom portion of the heat sink.

3. The electrically conductive ground strip of claim 1 wherein the ground strip further comprises a plurality of downwardly extending tabs that perform as a Faraday Cage to shield the integrated circuit from the influence of external electric fields.

4. The electrically conductive ground strip of claim 1 wherein the ground strip is a conductive material from the group consisting of brass, copper or stainless steel.

5. A heat sink retention module assembly comprising:
   a retention module for vertically supporting a heat sink that is located above, and in thermal contact with an integrated circuit package; and
   a ground strip coupled to the retention module, the ground strip comprising:
      an upwardly extending spring member that provides an electrical contact with a bottom surface of the heat sink, and
      a foot member forming a ground pad to provide an electrical contact with a ground connection of a circuit board located below the retention module and the integrated circuit package.

6. The heat sink retention module of claim 5 wherein the spring member is an upwardly extending finger having a first deflectable end that contacts a bottom portion of the heat sink.

7. The heat sink retention module of claim 5 wherein the ground strip further comprises a plurality of downwardly extending tabs that perform as a Faraday Cage to shield the integrated circuit from the influence of external electric fields.

8. The heat sink retention module of claim 5 wherein the spring member comprises a plurality of upwardly extending fingers having a first deflectable end that contacts a bottom portion of the heat sink.

9. An integrated circuit assembly comprising:
   an integrated circuit package comprising an integrated circuit, the integrated circuit package is coupled to a circuit board;
   a heat sink located above the integrated circuit package and in thermal contact with the integrated circuit package, the heat sink comprises an electrically conductive base;
   first and second retention modules located between the heat sink and the circuit board for providing vertical support to the heat sink; and
   an electrically conductive ground strip coupled the first retention module and the circuit board, the ground strip comprises an upwardly extending deflectable finger that contacts the heat sink base to provide an electrical ground path from the heat sink to the circuit board.

10. The integrated circuit assembly of claim 9 wherein the ground strip further comprises a plurality of downwardly extending tabs that perform as a Faraday Cage to shield the integrated circuit from the influence of external electric fields.

11. The integrated circuit assembly of claim 9 wherein the retention modules are affixed to the circuit board using expandable fasteners.

12. The integrated circuit assembly of claim 9 further comprising first and second retention clips to respectively secure the heat sink to the first and second retention modules.

13. A method of EMI suppression for an integrated circuit coupled to a circuit board comprising;
   thermally coupling an electrically conductive heat sink to an integrated circuit package;
   vertically supporting the heat sink with a retention module; and
   providing an electrically conductive path between the heat sink and the circuit board using an electrically conductive ground strip located with the retention module.

14. The method of claim 13 wherein the electrically conductive path is provided by contacting the heat sink with at least one deflectable finger of the ground strip, and coupling the ground strip to a ground connection of the circuit board.

15. The method of claim 13 wherein the ground strip comprises:
   an upwardly extending deflectable finger that contacts a base of the heat sink; and
   a foot member forming a ground pad to provide an electrical contact with a ground connection of a circuit board located below the retention module and the integrated circuit package.

16. The method of claim 15 wherein the ground strip further comprises a plurality of downwardly extending tabs that perform as a Faraday Cage to shield the integrated circuit from the influence of external electric fields.

17. An electrically conductive ground strip comprising:
   a spring member that provides an electrical contact with a surface of a heat sink when the heat sink is positioned above an integrated circuit that is coupled to a circuit board;
   a plurality of downwardly extending tabs that perform as a Faraday Cage to shield the integrated circuit from the influence of external electric fields; and
   a foot member forming a ground pad to provide an electrical contact with a ground connection of the circuit board.

* * * * *